US010172453B1

(12) United States Patent
Redfern et al.

(10) Patent No.: US 10,172,453 B1
(45) Date of Patent: Jan. 8, 2019

(54) SYSTEM EQUIPMENT CARRIERS AND RELATED METHODS

(71) Applicant: VCE Company, LLC, Richardson, TX (US)

(72) Inventors: Scott Daniel Redfern, Monroe, CT (US); Gerald Allan Bagni, Pembroke, MA (US); Samuel M. Marrs, Bradley, IL (US); Alva B. Eaton, Nottingham Park, IL (US)

(73) Assignee: VCE IP HOLDING COMPANY LLC, Richardson, TX (US)

( * ) Notice: Subject to any disclaimer, the term of this patent is extended or adjusted under 35 U.S.C. 154(b) by 160 days.

(21) Appl. No.: 14/193,060

(22) Filed: Feb. 28, 2014

(51) Int. Cl.
*A47B 47/00* (2006.01)
*H05K 7/14* (2006.01)

(52) U.S. Cl.
CPC ........... *A47B 47/00* (2013.01); *H05K 7/1488* (2013.01)

(58) Field of Classification Search
CPC . A47B 47/00; G06F 1/183; G06F 1/20; G06F 2200/201; H05K 7/20781; H05K 7/1488; H02B 1/202; H02G 3/32
USPC .......................................... 211/26, 26.2, 195
See application file for complete search history.

(56) References Cited

U.S. PATENT DOCUMENTS

| | | | | |
|---|---|---|---|---|
| 3,218,518 A * | 11/1965 | Ashbridge | ............... | H05K 7/18 361/730 |
| 3,482,895 A * | 12/1969 | Becklin | .................. | A47B 96/06 206/305 |
| 5,112,119 A * | 5/1992 | Cooke | ..................... | G06F 1/184 312/283 |
| 5,673,171 A * | 9/1997 | Varghese | ............... | G11B 33/08 248/615 |
| 6,075,694 A * | 6/2000 | Mills et al. | ............... | 361/679.02 |
| 6,123,203 A * | 9/2000 | Gibbons | .............. | H05K 7/1421 211/26 |
| 6,181,549 B1* | 1/2001 | Mills | .................... | H05K 7/1489 292/114 |
| 6,247,944 B1* | 6/2001 | Bolognia | ................ | G06F 1/184 439/157 |
| 6,297,962 B1* | 10/2001 | Johnson et al. | ............... | 361/726 |
| 6,591,997 B2* | 7/2003 | Hung | ............................ | 211/183 |
| 6,600,656 B1* | 7/2003 | Mori | .................... | H05K 7/1421 174/168 |
| 6,796,833 B2* | 9/2004 | Baker | ........................ | 439/540.1 |
| 7,055,701 B2* | 6/2006 | Dean | .................... | H05K 7/1489 211/190 |
| 7,123,485 B1* | 10/2006 | Henderson | .......... | H01M 2/1005 211/209 |
| 7,301,756 B2* | 11/2007 | Wayman | .............. | H05K 7/1489 361/679.01 |

(Continued)

*Primary Examiner* — Ko H Chan
(74) *Attorney, Agent, or Firm* — Jenkins, Wilson, Taylor, & Hunt P.A.

(57) ABSTRACT

System equipment carriers and related methods can include two side panels coupled together in a spaced apart relationship with respect to one another by a base panel to form an equipment carrier, the equipment carrier being configured to receive and support a plurality of individual component modules therein. In this configuration, the equipment carrier and the plurality of individual component modules received therein are configured to be positioned together within an equipment enclosure that is configured to receive individual component modules therein.

15 Claims, 6 Drawing Sheets

(56) References Cited

U.S. PATENT DOCUMENTS

| | | | | |
|---|---|---|---|---|
| 7,656,655 | B2* | 2/2010 | Fan | G06F 1/187 |
| | | | | 361/679.33 |
| 7,995,335 | B2* | 8/2011 | Chang et al. | 361/679.33 |
| 8,152,249 | B2* | 4/2012 | Becklin | H05K 7/1421 |
| | | | | 312/223.1 |
| 8,493,716 | B2* | 7/2013 | Scavuzzo | H05K 5/0208 |
| | | | | 361/679.01 |
| 9,699,935 | B1* | 7/2017 | Marrs | H05K 7/183 |
| 2008/0035588 | A1* | 2/2008 | Liang | H05K 7/1421 |
| | | | | 211/26 |
| 2008/0285221 | A1* | 11/2008 | Imsand et al. | 361/681 |
| 2009/0152216 | A1* | 6/2009 | Champion et al. | 211/26 |
| 2009/0294606 | A1* | 12/2009 | Chen | 248/205.1 |
| 2011/0133620 | A1* | 6/2011 | Coglitore et al. | 312/326 |
| 2011/0227466 | A1* | 9/2011 | Peng | H05K 7/1489 |
| | | | | 312/223.2 |
| 2012/0007478 | A1* | 1/2012 | Fan | H05K 7/1488 |
| | | | | 312/223.2 |
| 2012/0043869 | A1* | 2/2012 | Liu | H05K 7/1488 |
| | | | | 312/223.2 |
| 2012/0293954 | A1* | 11/2012 | Peng et al. | 361/679.58 |

* cited by examiner

SYSTEM EQUIPMENT CARRIERS AND RELATED METHODS

TECHNICAL FIELD

The subject matter described herein relates generally to rack-mounted equipment. More specifically, the subject matter relates to system equipment carriers and related methods.

BACKGROUND

Conventionally, converged infrastructure systems (CISs) and other upgrades and/or offerings are shipped as individual components to the customer site, where service personnel needed to be brought in to implement these components on-site. Specifically, for example, in some situations, all of the individual equipment modules could be assembled, configured (e.g., cabled together), and tested. This assembly was commonly done at the site of the CIS provider. Once the CIS was ready, the equipment could be transported to the client site on a specialty shipment rack that was designed to protect the equipment from potential damage during transit to the final installation site. Upon arrival at the client site, however, the individual components would need to be disassembled and unpackaged from the shipment rack to be reinstalled into existing equipment racks at the client site. The equipment would often then need to be reconnected and tested to ensure that the system was properly reconfigured.

As a result, although the initial assembly and testing could be useful to ensure the operability of the equipment and to show the on-site installer how the system was intended to be cabled or otherwise configured, much of the initial work was duplicated during the on-site installation. Accordingly, implementation in this manner can be inefficient, costly, and it can allow additional errors to be introduced through multiple installations of the equipment. Additionally, it can negate the perceived value of the shipment rack.

SUMMARY

System equipment carriers and related methods are disclosed. According to one exemplary embodiment, a system equipment carrier comprises two side panels coupled together in a spaced apart relationship with respect to one another by a base panel to form an equipment carrier, the equipment carrier being configured to receive and support a plurality of individual component modules therein. In this configuration, the equipment carrier and the plurality of individual component modules received therein are configured to be positioned together within an equipment enclosure that is configured to receive individual component modules therein.

BRIEF DESCRIPTION OF THE DRAWINGS

The subject matter described herein will now be explained with reference to the accompanying drawings of which.

DETAILED DESCRIPTION

The subject matter described herein discloses electronic system equipment carriers, carrier housings, and related methods for holding and shipping rack-mounted equipment. In particular, the present subject matter discloses equipment carriers that are configured to couple together an arrangement of individual component modules of converged infrastructure systems (CISs) so that they can be transported and/or installed into existing equipment enclosures as a unit. In this regard, the present equipment carriers can allow CISs to be shipped in a preconfigured, assembled state that can be readily installed into the existing equipment enclosures. As a result, the present subject matter can reduce or eliminate duplicative assembly and testing during on-site installation.

As used herein, CISs, such as Vblock™ Systems from VCE Company, LLC, can comprise multiple components or elements in a preconfigured or prepackaged computing platform. For example, a CIS can comprise a computing platform or unit associated with racks of physical components and related software for performing virtualization and/or other functions. In some embodiments, a CIS can comprise multiple components that include one or more computing components, software components, networking components, storage components, hardware components, and/or firmware components. For example, an exemplary CIS can comprise data storage devices, servers, networking equipment, and software for managing physical resources and/or virtualized resources (e.g., virtual servers).

Reference will now be made in detail to exemplary embodiments of the subject matter described herein, examples of which are illustrated in the accompanying drawings. Wherever possible, the same reference numbers will be used throughout the drawings to refer to the same or like parts.

Figure 1:
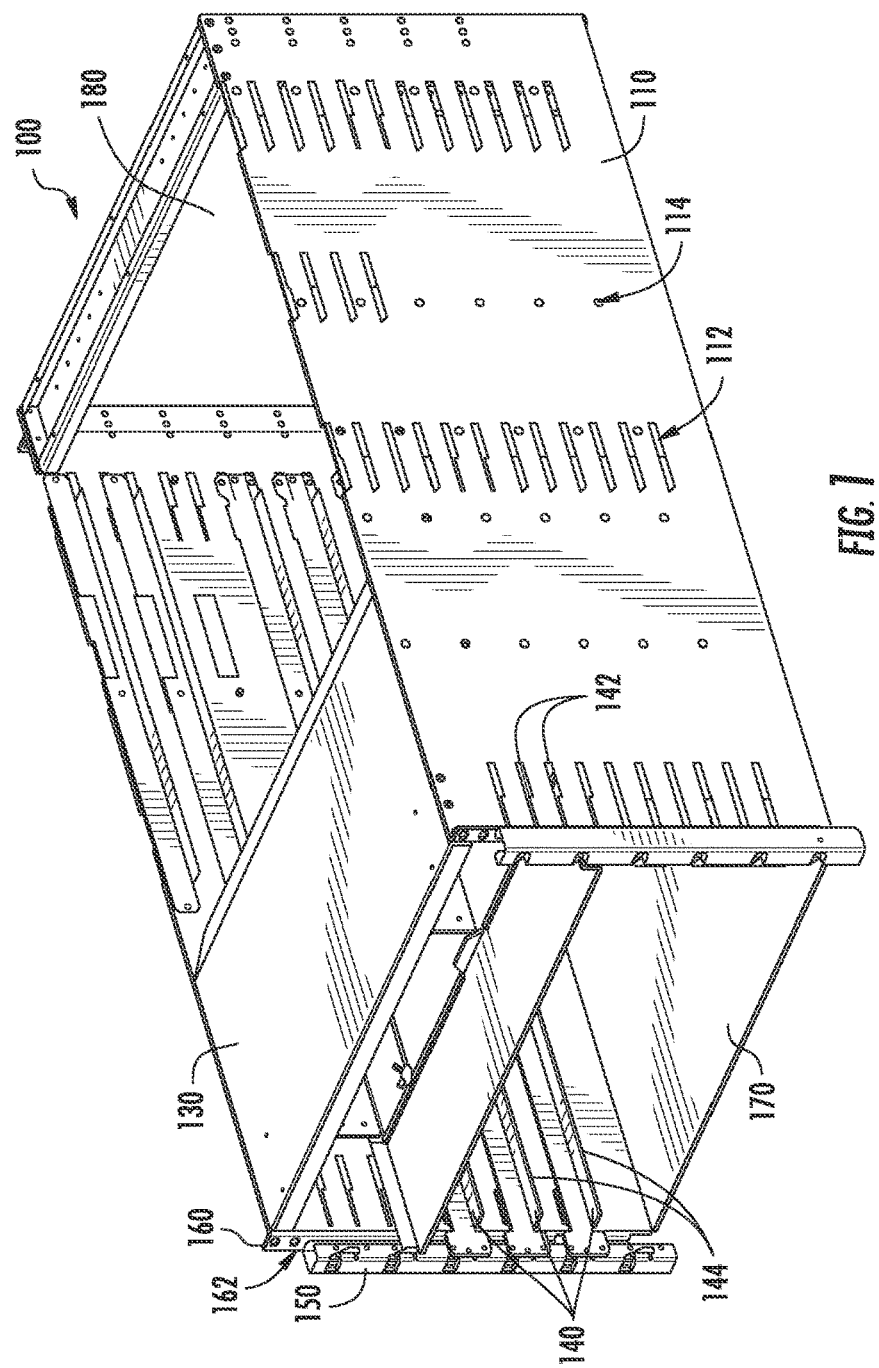
FIG. 1 is a perspective view illustrating an exemplary system equipment carrier according to an embodiment of the subject matter described herein.

FIG. 1 is a perspective view illustrating an exemplary equipment carrier, generally designated 100, according to an embodiment of the subject matter described herein. Equipment carrier 100 can be configured to hold rack-mounted equipment, such as elements of CISs, including components, physical resources, and/or virtual resources. In some embodiments, for example, elements of CISs can comprise computing elements, software elements, networking elements, storage elements, hardware elements, and/or firmware elements, including all or any combination thereof. For example, an exemplary CIS can comprise data storage devices, servers, switches, networking equipment, and software for managing physical resources and/or virtualized resources (e.g., virtual servers). In addition, equipment carrier 100 can support data protection offerings and pre-packaged upgrades.

Regardless of the particular types of rack-mounted equipment to be carried, equipment carrier 100 can be configured to hold a plurality of individual components occupying multiple rack-units (RU or U). In the particular configuration shown in FIG. 2, for example, equipment carrier 100 can be configured to hold an arrangement of component modules 10 occupying 6 RU. It is noted, however, that equipment carrier 100 can be sized to hold more or less rack-units (e.g. 3, 10, or 15 RU). Accordingly, although equipment carrier 100 is discussed and shown with respect to particular configurations herein, those having skill in the art will recognize that the features of equipment carrier 100 can be scaled or otherwise adapted to carry equipment in any of a variety of equipment configurations and varied numbers of equipment modules.

As discussed above, previously in the industry when a customer orders a CIS-based or similar equipment system, individual components were shipped to the customer site, where service personnel were brought in to implement the components on-site. Specifically, for example, even though the CISs can be shipped in a preconfigured, assembled state, service personnel are typically needed to uncable and unpackage the individual components from the shipment rack only to then re-assemble, re-cable, and test the components once they have arrived at the client site.

By comparison, the equipment carrier illustrated for example in FIG. 1 removes the necessity of these on-site implementation steps. In the exemplary configuration shown in FIG. 2, for example, equipment carrier 100 can hold an arrangement of individual component modules 10, which can be integrated, cabled, and tested at one site (e.g. at the manufacturer) and then dynamically shipped as a unit to the customer's location. In this embodiment, equipment carrier 100 is configured such that the customer can slide equipment carrier 100, with component modules 10 kept in their as-installed state, into an existing rack and then plug in power and network connections. In addition, equipment carrier 100 can be configured to be integrated into any of a variety of types of equipment racks. For example, equipment carrier 100 can be coupled into a standardized customer 19" Electronic Industries Affiance (EIA) rack or an existing CIS cabinet. Alternatively or in addition, equipment carrier 100 can be configured to be coupled into a stand-alone system housing for independent floor and/or shelf placement of equipment carrier 100 as described in further detail hereinbelow (see, for e.g., FIG. 5).

Figure 2:
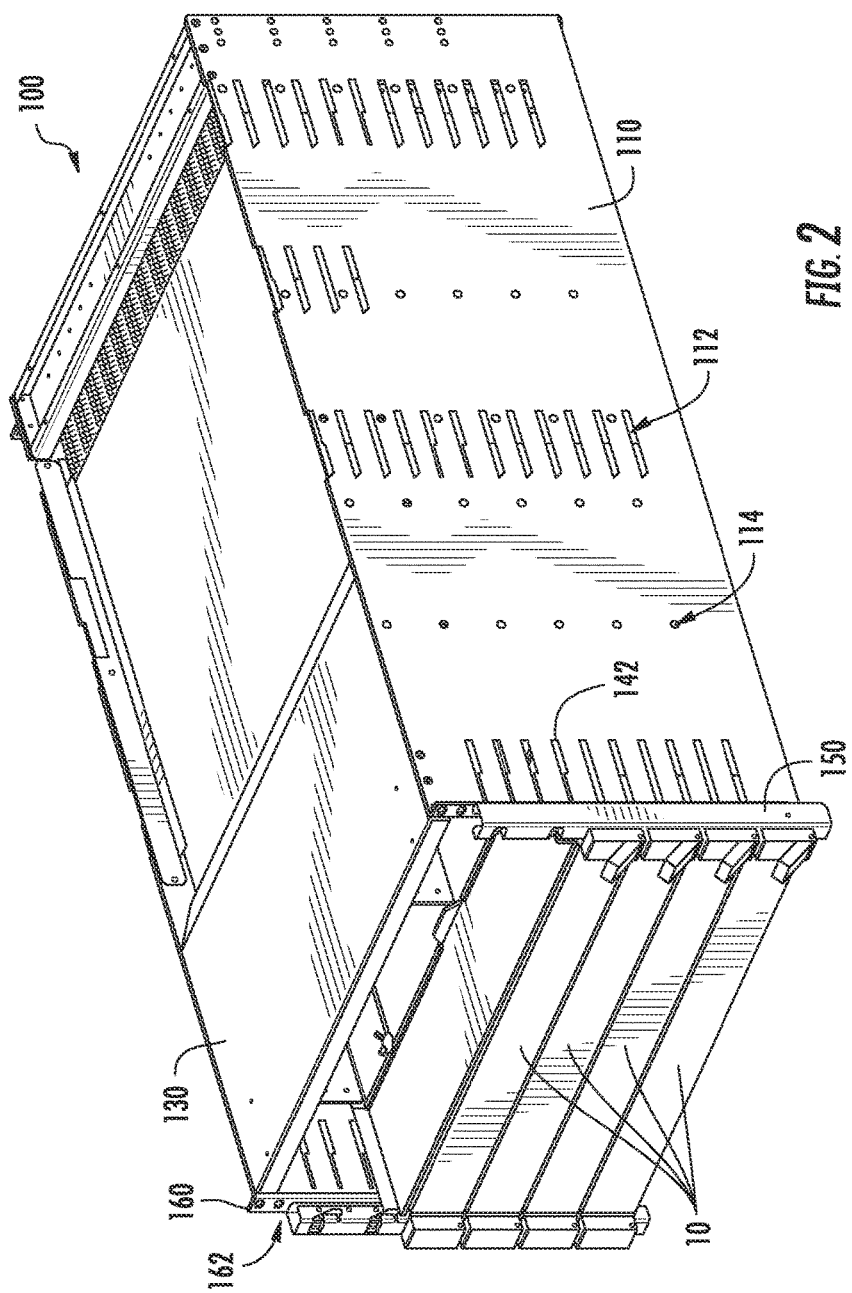
FIG. 2 is a perspective view illustrating the exemplary system equipment carrier holding multiple equipment component modules according to an embodiment of the subject matter described herein.

Regarding the particular configuration of equipment carrier 100, FIGS. 1 through 3B illustrate exemplary implementations of the subject matter disclosed herein. As shown in FIGS. 1 and 2, for example, equipment carrier 100 can be a receptacle composed of substantially rigid structural materials and manufactured with dimensions and tolerances selected based on the corresponding rack, existing CIS cabinet or system housing, or stand-alone enclosure with which equipment carrier 100 is intended to be coupled. Where rack dimensions are unknown, equipment carrier 100 can be a receptacle having sufficient dimensions and tolerances that enable carrier 100 to slide into a standardized customer 19" EIA rack. In the embodiment illustrated in FIGS. 1 and 2, for example, equipment carrier 100 is sized to occupy 7 RU of space in a destination rack (e.g. 6 RU of components and 1 RU for support structures and cable pass through).

Regardless of the particular size or configuration, equipment carrier 100 can include at least some common elements. In particular, in one aspect, equipment carrier 100 can comprise two side panels 110, which can comprise sheet metal (e.g., steel, aluminum, or other metal) or any other material with similar properties. Side panels 110 can be of substantially equal length and can be positioned substantially parallel to one another. Side panels 110 can be spaced apart from one another by a base panel 170, such that side panels 110 are attached to base panel 170 at substantially right angles and form a substantially u-shaped structure. Side panels 110 can be welded, screwed, or otherwise attached to base panel 170. Base panel 170 can comprise sheet metal or any other material with similar properties. Additionally, side panels 110 and base panel 170 can be sized so that individual components can fit in-between the u-shaped structure formed by the attachment of side panels 110 to base panel 170 as shown in FIG. 2.

Side panels 110 can be formed with a plurality of slots 112, which can be formed in side panels 110 and configured to receive one or more removable rails 140. Removable rails 140 can be configured to receive one or more of component modules 10 thereon to provide structural support and positioning of the one or more of component modules 10 within equipment carrier 100. In particular, removable rails 140 can be selectively connected to side panels 110 by engaging one or more projections 142 of removable rails 140 with a respective one or more of slots 112. In this regard, slots 112 and projections 142 can be manufactured to be removably compatible with one another. For example, slots 112 can be slightly larger than projections 142, which can be inserted through slots 112 for a secure fit. Slots 112 can be shaped in any manner compatible with a shape of projections 142.

Side panels 110 can further include a plurality of perforations 114, which can be formed throughout side panels 110. Perforations 114 can be either randomly or systematically disposed on side panels 110. In one aspect, perforations 114 can be positioned to receive various removable components on equipment carrier 100. For example, ducting 130 can be removably attached to side panels 110 at perforations 114. Perforations 114 strategically disposed elsewhere on side panels 110 can be used to attach other components, such as removable rails 140 discussed above, to side panels 110. Alternatively or in addition, perforations 114 can be disposed in a pattern that provides improved air cooling to component modules 10 coupled to equipment carrier 100. In addition, perforations 114 can be either similarly or differently shaped (e.g. some or all of perforations 114 can be circular). Rear panel 180 can be attached to both base panel 170 and to a rear end of side panels 110 to provide closure and support to equipment carrier 100. Rear panel 180 can optionally comprise various ports, for example a 15 A mini power outlet unit (POU), 125/250V C13 ports, and/or Ethernet management ports.

Referring again to the supporting elements that can be configured to position and support one or more of component modules 10 within equipment carrier 100, ducting 130 and removable rails 140 can be removably attachable to side panels 110 and can hold component modules 10 within. In one aspect, ducting 130 can hold and maintain switches, such as top-of-rack (ToR) switches. In particular, for example, in the embodiment illustrated in FIGS. 1 and 2, ducting 130 can span the distance between side panels 110 and have projections received in slots 112 on side panels 110. In this configuration, ducting 130 takes up 2 RU.

Removable rails 140 can extend on either one or both of side panels 110 to mount component modules 10 via an inwardly extending support shelf 144 and to provide increased front-rear stability of equipment carrier 100. In this configuration, removable rails 140 provide support in a manner similar to rails, slides, or other support elements that are commonly used to support heavy equipment or to provide ready access to equipment that is commonly accessed for servicing (i.e., by allowing such structures to not be bolted in place with respect to the equipment rack). Inwardly extending support shelf 144 can extend towards a center of the u-shape formed by base panel 170 and side panels 110. As illustrated in FIG. 1, removable rails 140 are positioned to receive 4 RU of component modules 10. In FIG. 2, removable rails 140 provide a stable support for four component modules 10 taking up 4 RU. In such a context, removable rails 140 can extend to a length substantially equal to that of side panels 110 and can be attached to side panels 110 via projections 142 received in slots 112 on side panels 110. In some aspects, removable rails 140 can extend substantially the entire length of equipment carrier 100 (e.g., about 29 inches, with a tolerance of +/−0.25 inches).

To secure equipment carrier 100 into a standardized customer 19" EIA rack, an existing CIS cabinet or system housing, or a stand-alone enclosure, one or more mounting flanges 160 can be disposed at one end (e.g., a "front" end) of either one or both of side panels 110. In particular, for example, mounting flanges 160 can each extend outwardly in a direction substantially perpendicular to side panels 110 and can be either integrally formed with side panels 110, or they can be separate components. Mounting flanges 160 can further comprise a plurality of mounting holes 162 that can be linearly disposed on each of mounting flanges 160. Mounting holes 162 can be sized to receive mounting nuts and screws or other fasteners. In addition, in order to accommodate non-EIA racks, adaptor rails 150 can be mounted over mounting flanges 160. In one aspect, for example, adapter rails 150 can comprise one or more hooks or latches that are configured to engage corresponding slots on certain kinds of equipment enclosures. To increase overall stability of equipment carrier 100, removable rails 140 can be additionally secured to adaptor rails 150 (e.g., in addition to being coupled to side walls 110 directly).

Figure 3A:
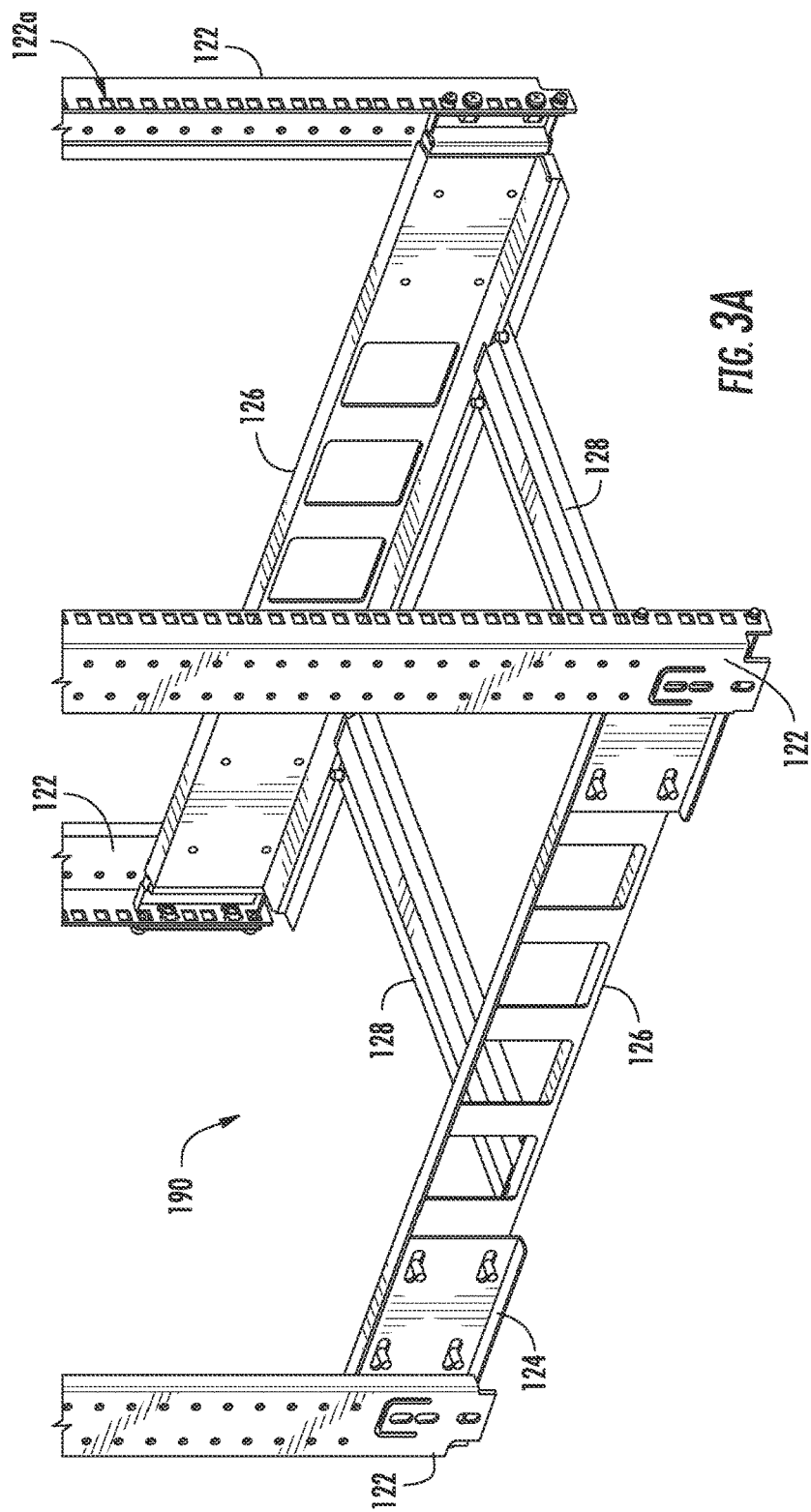
FIG. 3A is a perspective view illustrating an exemplary support structure for a system equipment carrier according to an embodiment of the subject matter described herein.
Figure 3B:
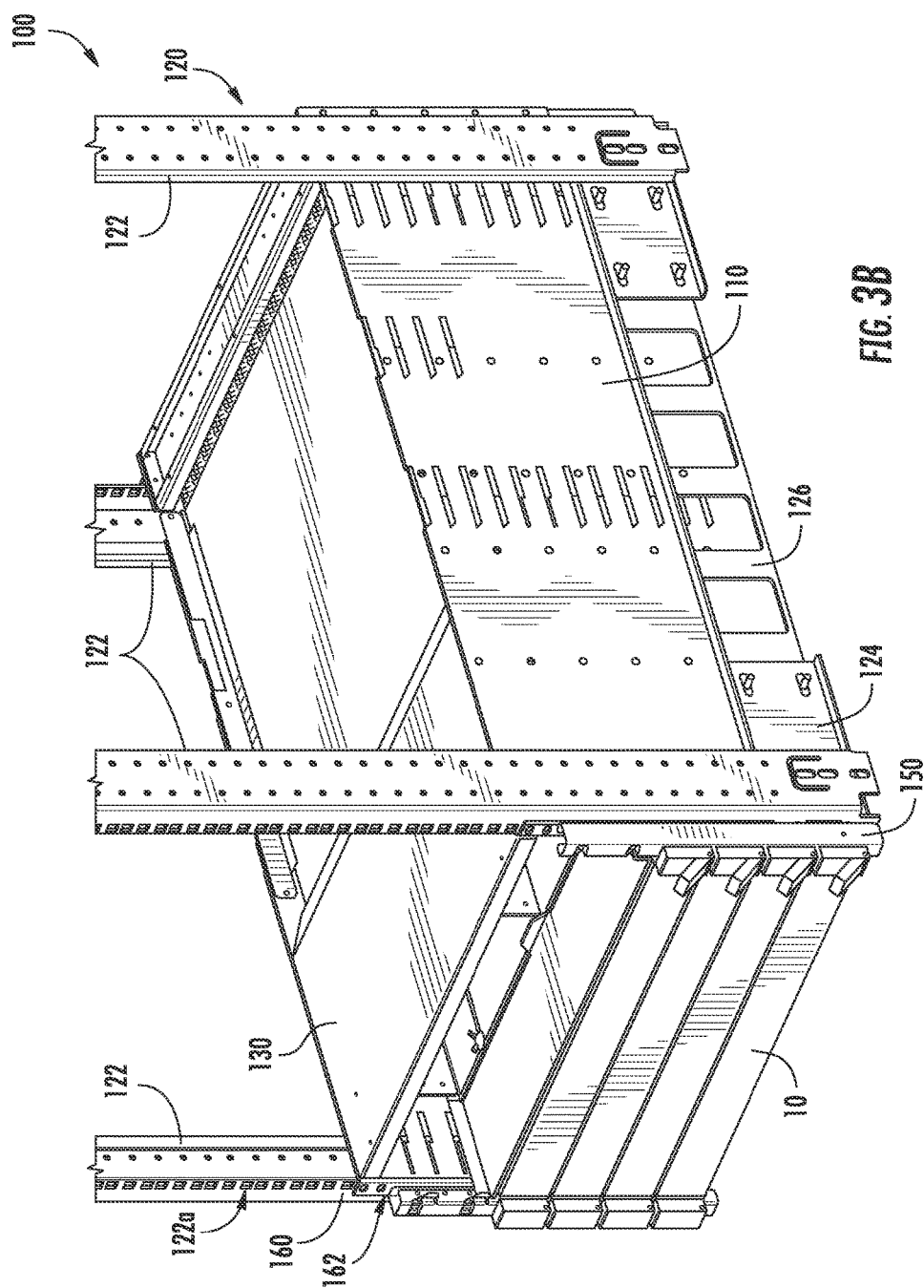
FIG. 3B is a perspective view illustrating an exemplary system equipment carrier positioned within an equipment rack according to an embodiment of the subject matter described herein.

In one particular configuration shown in FIGS. 3A and 3B, for example, equipment carrier 100 can be connected to an equipment rack 120 (e.g., a standardized EIA 19" equipment rack). In conventional configurations, equipment rack 120 can comprise two or more posts 122 to which one or more components can be attached and supported. In the embodiment illustrated in FIG. 3A, for example, equipment rack 120 comprises four posts 122 made up of two front posts and two rear posts. Those having skill in the art will recognize, however, that a lesser or greater quantity of posts 122 can be utilized. In any configuration of equipment rack 120, one or more of posts 122 can include a plurality of attachment perforations 122a that can be linearly disposed along an inwardly extending flange of posts 122.

In conventional configurations, each equipment module is individually mounted within equipment rack 120. Thus, to minimize wasted space within equipment rack 120, equipment modules are commonly sized to fill substantially the entire width between opposing posts 122. As a result, to accommodate the additional materials of equipment carrier 100, side panels 110 can be sized to be as thin as possible to fit between a respective one of posts 122 and any of component modules 10 carried therein. In this regard, side panels 110 can be constructed of a single sheet of metal or other material so that they can fit within the space between posts 122 and component modules 10, even with tolerances taken into consideration.

Furthermore, in configurations where side panels 110 are configured to be very thin, equipment carrier 100 can be configured to provide additional structural support for component modules 10 carried therein. In this regard, equipment carrier 100 can comprise a base support structure 190 configured to provide a point of connection of equipment carrier 100 to equipment rack 120 and to provide additional structural support for equipment carrier 100. In one embodiment, for example, one or more support beams 126 can provide lengthwise connection between two of posts 122. In particular, for example, one of support beams 126 can connect two of posts 122 along each side of equipment rack 120. In addition, base support structure 190 can comprise one or more brackets 124 configured to connect support beams 126 to posts 122 (e.g., using fasteners to engage with attachment perforations 122a). Specifically, for example, base support structure 190 can comprise one of brackets 124 for connection to each of four posts 122 of equipment rack 120, with support beams 126 extending between each pair of front- and rear-connected brackets 124, such as is shown in FIG. 3A. Alternatively, support beams 126 can be configured to engage with posts 122 directly. Furthermore, base support structure 190 can additionally comprise one or more support ribs 128 for widthwise connection between support beams 126. As shown in FIG. 3A, for example, two of support ribs 128 can be attached at either end between support beams 126 to span the width of equipment rack 120.

In this configuration, base support structure 190 can provide a bottom platform onto which equipment carrier 100 can be positioned within equipment rack 120. As shown in FIG. 3B, for example, equipment carrier 100 can be positioned in the interior cavity formed by equipment rack 120 on top of base support structure 190. Accordingly, equipment carrier 100 can be configured to be sized slightly smaller than equipment rack 120, such that equipment rack 120 securely surrounds equipment carrier 100 to provide stability upon installation. In this arrangement support beams 126 can be positioned on the outside edges of side panels 110 (e.g., bracing against side panels 110), and support ribs 128 can be positioned at one or more positions beneath base panel 170 along the length of equipment carrier 100 (e.g., with base panel 170 sitting substantially flush against support ribs 128). In this arrangement, both lateral loads and vertical loads of equipment carrier 100 can be supported by base support structure 190.

In addition, equipment carrier 100 can further be connected to equipment rack 120 using conventional methods. In this regard, for example, mounting holes 162 on mounting flanges 160 of equipment carrier 100 can be sized and spaced commensurate with attachment perforations 122a on posts 122 and can be strategically disposed on mounting flanges 160. In such an arrangement, when equipment carrier 100 is positioned within equipment rack 120, mounting holes 162 and attachment perforations 122a can be aligned and secured to one another. Standard fasteners can be used to secure equipment carrier 100 to equipment rack 120 at the interface, although other methods of securing the interface can also be implemented. Mounting flanges 160 can be formed so that they outwardly extend, which allow mounting holes 162 to linearly align with attachment perforations 122a formed on posts 122. Depending on support considerations or logistical preference from the customer or the manufacturer, equipment carrier 100 can be secured to equipment rack 120 at varying linear points along posts 122 corresponding to the interface between mounting holes 162 and attachment perforations 122a. In addition, each of component modules 10 can individually be secured to equipment rack 120 (e.g., by engaging one or more of attachment perforations 122a) as needed.

Alternatively or in addition, further mounting elements can be used to couple equipment carrier 100 and/or each of component modules 10 to equipment rack 120. Specifically, for example, in addition to fasteners or other mounting elements being used to couple equipment carrier 100 and/or component modules 10 to one set of posts 122 of equipment rack 120 (e.g., a "front" pair of posts 122), brackets, fasteners, or other mounting elements can further be provided to additionally secure the respective ones of equipment carrier 100 and/or component modules 10 to a different set of posts 122 of equipment rack 120 (e.g., a "rear" pair of posts 122).

Figure 4:
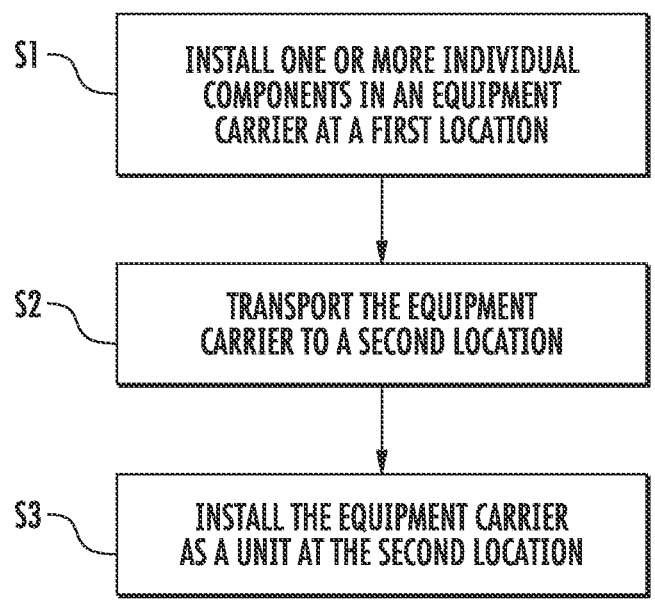
FIG. 4 is a diagram illustrating an exemplary method for installing rack-mounted equipment according to an embodiment of the subject matter described herein.

As indicated above, one feature of equipment carrier 100 is that it allows any installed equipment to be integrated, cabled, and tested at one site and then transported to and installed at a second location (e.g., a client site) without having to be retested and configured. In this regard, for example, a process flow diagram of an exemplary embodiment of a method for installing rack-mounted equipment can be seen in FIG. 4. In this exemplary method, a configuring step S1 can comprise installing one or more individual component modules 10 in an equipment carrier 100 at a first location, such as at the site of manufacture and/or assembly of a converged infrastructure system. This installation can involve integration, cabling, and testing of the arrangement of individual component modules 10. Once installed in equipment carrier 100, equipment carrier 100 (and all components carried therein) can be shipped as a unit in a transportation step S2 to a second location, such as the eventual installation site at a customer's location. Equipment carrier 100 can then be installed in an installing step S3 at the second location. In the embodiments discussed above, for example, this installation can simply require that equipment carrier 100 be inserted, with component modules 10 kept in their as-installed state, into an existing rack (e.g., an EIA 19" rack), and the unit can be connected to power and network connections. In this way, an efficient, standardized method is provided that minimizes the need for duplicative installation and testing of the connected components.

Figure 5:
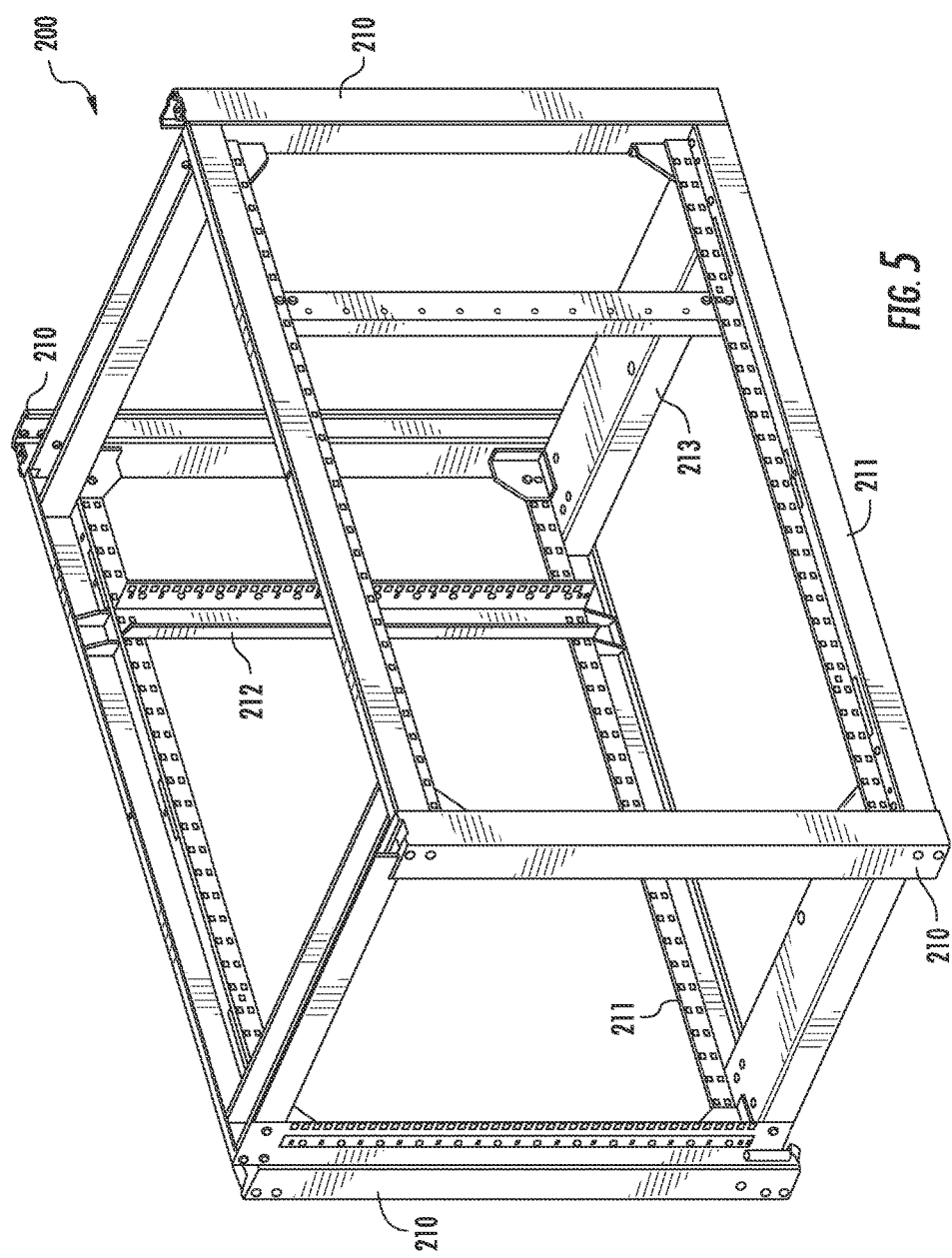
FIG. 5 is a perspective view illustrating an exemplary system housing for use with an equipment carrier according to an embodiment of the subject matter described herein.

Regarding the transportation of equipment carrier 100, FIG. 5 illustrates one embodiment of a system housing or enclosure, generally designated 200, which can be used for transportation of equipment carrier 100. In this aspect, equipment carrier 100 can be slid into system housing 200 prior to shipment, where system housing 200 is manufactured to provide structural integrity to equipment carrier 100 during transportation. Specifically, for example, system housing 200 can comprise a frame structure that equipment carrier 100 can fit and be secured within. Frame structure can be configured with standardized EIA mounting elements, thereby allowing equipment carrier 100 to be secured within system housing 200 using the same or similar methods and fasteners as are used to connect equipment carrier 100 to an equipment rack in which it is designed to be installed (e.g., equipment rack 120 discussed above). For example, equipment carrier 100 can be mounted to system housing 200 at mounting holes 162 disposed on mounting flanges 160. Furthermore, system housing 200 can be designed to meet the same dynamic shipping requirement as other shipping cabinets (e.g., ASTM D999 for sinusoidal vibration; ISTA 2B for random vibration; ASTM D 6179, Method C for rotational flat drop; ASTM D 6179, Method A for rotational edge drop; and/or ASTM D 40003 or ASTM D 880 for impact).

Regarding its particular construction, system housing 200 can have structural elements that are substantially similar to those of equipment rack 120. In the exemplary configuration shown in FIG. 5, for example, system housing 200 can comprise two or more posts 210 (e.g., two or four posts) that serve as vertical supports, a plurality of rails 211 arranged along longitudinal sides of system housing 200, and one or more cross-beams 213 to connect opposing sides of system housing 200. These structural elements can be coupled together by welding, bolting, or other connection methods known to those having skill in the art. In addition, one or more vertical ribs 212 can provide additional support and rigidity and/or to provide additional points of connection for equipment carrier 100. In addition, other types of rails and auxiliary support structures can similarly be attached to system housing 200 to provide increased support and ease of attachment. To help facilitate transportation of equipment carrier 100, system housing 200 can be mounted onto casters (not shown).

Alternatively or in addition, system housing 200 can be used for independent floor/shelf placement of equipment carrier 100. For example, where an end-user does not have an existing equipment framework (e.g., equipment rack 120), system housing 200 can be located at the end-user's location as a permanent support for equipment carrier 100 and component modules 10 carried thereon. In such configurations, system housing 200 can be provided with power distribution units (PDUs) or other connection elements to enable the integration of component modules 10 carried on equipment carrier 100 with other components in the end-user's network. Further in this regard, because system housing 200 can be particularly designed to the dimensions and specification of equipment carrier 100 (e.g., to surround and support equipment carrier 100 during transportation), there need not be any unused rack space. As a result, the use of system housing 200 as an independent support structure can reduce the amount of floor and/or shelf space needed to accommodate component modules 10 carried by equipment carrier 100.

It will be understood that various details of the subject matter described herein may be changed without departing from the scope of the subject matter described herein. Furthermore, the foregoing description is for the purpose of illustration only, and not for the purpose of limitation, as the subject matter described herein is defined by the claims as set forth hereinafter.

What is claimed is:

1. An equipment carrier system for rack-mounted equipment, the equipment carrier system comprising:
a base support configured to be connected to an equipment enclosure, the base support comprising:
a first support beam configured to be connected to a first forward post of the equipment enclosure and a first rear post of the equipment enclosure;
a second support beam configured to be connected to a second forward post of the equipment enclosure and a second rear post of the equipment enclosure; and
one or more support ribs attached to both of the first support beam and the second support beam;
two side panels coupled together in a spaced apart relationship with respect to one another by a base panel to form a carrier, wherein each of the two side panels consists essentially of a single sheet of material, wherein the base support is configured to receive the carrier thereon with the two side panels bracing against the first support beam and the second support beam, respectively, for supporting the equipment carrier within the equipment enclosure;
one or more pairs of rails coupled to opposing interior surfaces of the two side panels, each pair of rails being configured to receive and support therebetween one of a plurality of individual rack-mountable component modules; and a mounting flange extending from one or both of the side panels, each mounting flange extending in a direction substantially perpendicular from an edge of the respective one or both of the side panels, the mounting flange being configured to couple the carrier to the equipment enclosure at one or more attachment perforations in the equipment enclosure while the plurality of individual component modules are positioned in the carrier;

wherein at least one of the plurality of rack-mountable component modules has dimensions selected to fill substantially an entire interior width of the equipment enclosure; and wherein the carrier and the plurality of individual rack-mountable component modules received therein are configured to be positioned together within the equipment enclosure.

2. The equipment carrier system according to claim 1, wherein the equipment enclosure comprises a standardized EIA 19" equipment rack.

3. The equipment carrier system according to claim 1, wherein each mounting flange comprises an adapter rail mounted to the mounting flange, the adapter rail being configured to be coupled to a corresponding post of the equipment enclosure to couple the carrier to the equipment enclosure.

4. The equipment carrier system according to claim 1, wherein the one or more pairs of rails comprise one or more removable rails that are selectively connected to one or more of the side panels.

5. The equipment carrier system according to claim 4, wherein each of the side panels comprises one or more slots formed therein and each of the one or more removable rails comprises one or more projections extending therefrom; and wherein the one or more removable rails are selectively connected to one or more of the side panels by engaging at least one of the one or more projections with a respective at least one of the one or more slots.

6. A rack-mounted equipment system comprising:
a base support configured to be connected to an equipment enclosure, the base support comprising:
a first support beam configured to be connected to a first forward post of the equipment enclosure and a first rear post of the equipment enclosure;
a second support beam configured to be connected to a second forward post of the equipment enclosure and a second rear post of the equipment enclosure; and
one or more support ribs attached to both of the first support beam and the second support beam;
two side panels coupled together in a spaced apart relationship with respect to one another by a base panel to form an equipment carrier, wherein each of the two side panels consists essentially of a single sheet of material, wherein the base support is configured to receive the carrier thereon with the two side panels bracing against the first support beam and the second support beam, respectively, for supporting the equipment carrier within the equipment enclosure;
one or more pairs of rails coupled to opposing interior surfaces of the two side panels;
a plurality of individual rack-mountable component modules having dimensions selected to fill substantially an entire interior width of the equipment enclosure, each of the plurality of individual rack-mountable component modules being positioned within the equipment carrier and supported between one of the pairs of rails, the plurality of individual rack-mountable component modules being connected together in a converged infrastructure system configuration; and a mounting flange extending from one or both of the side panels, each mounting flange extending in a direction substantially perpendicular from an edge of the respective one or both of the side panels, the mounting flange being configured to couple the equipment carrier to the equipment enclosure at one or more attachment perforations in the equipment enclosure while the plurality of individual rack-mountable component modules are positioned in the carrier;

wherein the equipment carrier and the plurality of individual rack-mountable component modules received therein are configured to be positioned together within the equipment enclosure.

7. The rack-mounted equipment system according to claim 6, wherein the one or more pairs of rails comprise one or more removable rails that are selectively connected to one or more of the side panels.

8. The rack-mounted equipment system according to claim 7, wherein each of the side panels comprises one or more slots formed therein and each of the one or more removable rails comprises one or more projections extending therefrom; and wherein the one or more removable rails are selectively connected to one or more of the side panels by engaging at least one of the one or more projections with a respective at least one of the one or more slots.

9. The rack-mounted equipment system according to claim 6, wherein each mounting flange comprises an adapter rail mounted to the mounting flange, the adapter rail being configured to be coupled to a corresponding post of the equipment enclosure to couple the equipment carrier to the equipment enclosure.

10. A method for installing rack-mounted equipment, the method comprising:
positioning a plurality of individual rack-mountable component modules in an equipment carrier, wherein the equipment carrier comprises two side panels coupled together in a spaced apart relationship with respect to one another by a base panel, wherein each of the two side panels consists essentially of a single sheet of material, and wherein at least one of the plurality of rack-mountable component modules has dimensions selected to fill substantially an entire interior width of an equipment rack;
connecting the plurality of individual rack-mountable component modules together in a converged infrastructure system configuration;
coupling a base support to the equipment rack, the base support comprising:
a first support beam configured to be connected to a first forward post of the equipment enclosure and a first rear post of the equipment enclosure;
a second support beam configured to be connected to a second forward post of the equipment enclosure and a second rear post of the equipment enclosure; and
one or more support ribs attached to both of the first support beam and the second support beam; and
positioning the equipment carrier and the plurality of individual component modules positioned therein as a unit on the base support within the equipment rack and securing the equipment carrier to the equipment rack at one or more attachment perforations in the equipment rack, wherein the side panels of the equipment carrier brace against the first support beam and the second support beam.

11. The method of claim 10, wherein positioning the plurality of individual rack-mountable component modules in the equipment carrier comprises positioning one or more of the plurality of individual rack-mountable component modules on one of one or more pairs of removable rails that are selectively connected to opposing interior surfaces of the side panels.

12. The method of claim 11, wherein positioning the one or more of the plurality of individual rack-mountable component modules on the one of the one or more pairs of removable rails comprises engaging one or more projections extending from the one or more removable rails with a respective one or more slots formed in the side panels of the equipment carrier.

13. The method of claim 11, wherein positioning the equipment carrier and the plurality of individual component modules positioned therein as a unit within the equipment rack comprises coupling a mounting flange that extends from an edge of the equipment carrier to the equipment rack.

14. The method of claim 13, wherein coupling the mounting flange to the equipment rack comprises coupling an adapter rail mounted to the mounting flange to the equipment rack.

15. The method of claim 10, wherein positioning the plurality of individual rack-mountable component modules in the equipment carrier and connecting the plurality of individual component modules together are performed at a first location; and
    wherein positioning the equipment carrier and the plurality of individual component modules positioned therein as a unit within the equipment rack is performed at a second location that is remote from the first location.

* * * * *